(12) United States Patent
Ryou

(10) Patent No.: US 9,635,232 B2
(45) Date of Patent: Apr. 25, 2017

(54) CAMERA MODULE HAVING MEMS ACTUATOR, CONNECTING METHOD FOR SHUTTER COIL OF CAMERA MODULE AND CAMERA MODULE MANUFACTURED BY THE SAME METHOD

(71) Applicant: LG INNOTEK CO., LTD., Seoul (KR)

(72) Inventor: Hyun Woo Ryou, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/599,244

(22) Filed: Jan. 16, 2015

(65) Prior Publication Data

US 2015/0131000 A1 May 14, 2015

Related U.S. Application Data

(63) Continuation of application No. 13/698,218, filed as application No. PCT/KR2011/003728 on May 20, 2011, now Pat. No. 8,970,781.

(30) Foreign Application Priority Data

May 20, 2010 (KR) .................. 10-2010-0047444
Oct. 8, 2010 (KR) .................. 10-2010-0098431

(51) Int. Cl.
*H04N 5/68* (2006.01)
*H04N 5/228* (2006.01)
(Continued)

(52) U.S. Cl.
CPC ......... *H04N 5/2257* (2013.01); *B81B 7/0006* (2013.01); *B81B 7/007* (2013.01);
(Continued)

(58) Field of Classification Search
CPC .. H04N 5/2252; H04N 5/2253; H04N 5/2254; H04N 5/2228; H04N 5/23264; H04N 5/23248; G02B 27/646
(Continued)

(56) References Cited

U.S. PATENT DOCUMENTS 7,772,542 B2    8/2010   Ishikawa
7,795,577 B2    9/2010   Olsen et al.
(Continued)

FOREIGN PATENT DOCUMENTS

CN         2606377 Y     3/2004
EP          1471731 A2    10/2004
(Continued)

*Primary Examiner* — Chia-Wei A Chen
(74) *Attorney, Agent, or Firm* — Birch, Stewart, Kolasch & Birch, LLP

(57) ABSTRACT

Disclosed is a camera module including a substrate which is provided with an electrode pad and an image sensor; a housing which is stacked on the substrate and of which an upper portion is opened so that light is incident to the image sensor; a MEMS actuator which is installed at the housing and has an electrode terminal at one side thereof, and a conductive pattern which is formed at the housing, wherein a lower end of the conductive pattern is connected with the electrode pad of the substrate, and an upper end thereof is connected with the electrode terminal of the MEMS actuator, whereby it is possible to improve electrical reliability between the electrode terminal of the MEMS actuator and the electrode pad of the substrate and facilely form the electrical connection therebetween, thereby reducing the number of processes.

14 Claims, 8 Drawing Sheets

(51) Int. Cl.

| | | |
|---|---|---|
| *G03B 13/00* | (2006.01) | |
| *H04N 5/232* | (2006.01) | |
| *H04N 5/225* | (2006.01) | |
| *G02B 7/08* | (2006.01) | |
| *G03B 3/10* | (2006.01) | |
| *B81B 7/00* | (2006.01) | |
| *B81B 7/02* | (2006.01) | |
| *G03B 9/08* | (2006.01) | |

(52) U.S. Cl.
CPC ............... *B81B 7/02* (2013.01); *G02B 7/08* (2013.01); *G03B 3/10* (2013.01); *G03B 9/08* (2013.01); *H04N 5/2253* (2013.01); *H04N 5/2254* (2013.01); *G03B 2205/0084* (2013.01)

(58) Field of Classification Search
USPC ......... 348/208.1–208.99, 373–376, 345–357
See application file for complete search history.

(56) References Cited

U.S. PATENT DOCUMENTS

| | | | |
|---|---|---|---|
| 8,064,146 B2 | 11/2011 | Iwasaki | |
| 8,130,315 B2 | 3/2012 | Kinoshita | |
| 8,717,487 B2 | 5/2014 | Azuma | |
| 2006/0082250 A1 | 4/2006 | Ko et al. | |
| 2006/0267420 A1* | 11/2006 | Naganuma et al. | 310/49 R |
| 2007/0159030 A1* | 7/2007 | Naganuma et al. | 310/49 R |
| 2007/0217775 A1* | 9/2007 | Shirono et al. | 396/72 |
| 2008/0192363 A1* | 8/2008 | Shirono et al. | 359/698 |
| 2008/0198254 A1* | 8/2008 | Nagasaki | 348/335 |
| 2008/0240707 A1* | 10/2008 | Yasuda et al. | 396/463 |
| 2008/0267603 A1 | 10/2008 | Jung et al. | |
| 2009/0009975 A1 | 1/2009 | Seo | |
| 2009/0025477 A1 | 1/2009 | Pilchowski et al. | |
| 2009/0168146 A1 | 7/2009 | Hornbeck | |
| 2009/0201414 A1 | 8/2009 | Kinoshita | |
| 2010/0037443 A1* | 2/2010 | Wu et al. | 29/256 |
| 2010/0158508 A1 | 6/2010 | Kim | |
| 2010/0158509 A1 | 6/2010 | Kim et al. | |
| 2010/0201794 A1 | 8/2010 | Kido et al. | |
| 2010/0309369 A1 | 12/2010 | Jarvis et al. | |
| 2011/0043687 A1 | 2/2011 | Chang | |
| 2011/0063492 A1 | 3/2011 | Jung | |
| 2011/0065292 A1* | 3/2011 | Chang | H01R 13/24 439/65 |
| 2011/0080515 A1* | 4/2011 | Kang | H01L 27/14618 348/374 |
| 2011/0090632 A1 | 4/2011 | Raff et al. | |
| 2011/0102667 A1 | 5/2011 | Chua et al. | |
| 2011/0109194 A1 | 5/2011 | Hung et al. | |
| 2011/0157462 A1 | 6/2011 | Huang | |
| 2011/0164365 A1 | 7/2011 | McClure et al. | |
| 2011/0194014 A1 | 8/2011 | Ozaki | |
| 2011/0244165 A1 | 10/2011 | Hill et al. | |
| 2012/0268644 A9 | 10/2012 | Lin | |
| 2013/0223835 A1* | 8/2013 | Koeroghlian et al. | 396/463 |

FOREIGN PATENT DOCUMENTS

| | | |
|---|---|---|
| EP | 1992968 A1 | 11/2008 |
| EP | 2096477 A1 | 9/2009 |
| JP | 2005-94105 A | 4/2005 |
| JP | 2006-238586 A | 9/2006 |
| KR | 10-2008-0090126 A | 10/2008 |
| KR | 10-2009-0046307 A | 5/2009 |
| KR | 10-2009-0119243 A | 11/2009 |
| KR | 10-2009-0120983 A | 11/2009 |
| KR | 10-2010-0008529 A | 1/2010 |
| KR | 10-2010-0019777 A | 2/2010 |

* cited by examiner

CAMERA MODULE HAVING MEMS ACTUATOR, CONNECTING METHOD FOR SHUTTER COIL OF CAMERA MODULE AND CAMERA MODULE MANUFACTURED BY THE SAME METHOD

CROSS-REFERENCE TO RELATED APPLICATIONS

This application is a Continuation of co-pending U.S. application Ser. No. 13/698,218 filed on Nov. 15, 2012, which is the National Phase of PCI International Application No. PCT/KR2011/003728 filed on May 20, 2011, which claims priority to Patent Application No. 10-2010-0047444 filed in the Republic of Korea on May 20, 2010, and Patent Application No 10-2010-0098431 filed in the Republic of Korea on Oct. 8, 2010. The entire content of all of the above applications are hereby expressly incorporated by reference.

TECHNICAL FIELD

The present invention relates to a camera module, and particularly to a camera module which can facilely form an electrical connection between an MEMS (Micro Electro Mechanical Systems) actuator and an electrode pad of a substrate, a connecting method for a shutter coil of the camera module, which can easily form a connection between the shutter coil and an output terminal pad of a PCB (Printed Circuit Board) through welding, and a camera module manufactured by using the same method.

BACKGROUND ART

Generally, a compact camera module is being applied to various IT equipment and mobile communication devices such as a camera phone, a PDA and a smart phone.

The camera module includes an image sensor such as CCD and CMOS as a main component, and it is so manufactured as to be capable of adjusting focus, thereby controlling an image size.

Herein, the camera module includes a plurality of lenses, and each lens is movably arranged so that a relative distance can be changed to control a focal distance.

Recently, a study on realizing auto-focus using an MEMS actuator instead of an existing VCM (Voice Coil Motor) has been actively carried out.

In the MEMS actuator, a moving lens is fixed to a silicon wafer instead of the existing VCM. Therefore, when a voltage is applied, a portion to which the moving lens is fixed is move up and down by electrostatic force to minutely adjust the moving lens, thereby performing an auto-focusing function.

As shown in FIG. 1, an electrode terminal 11 of the MEMS actuator 10 and an electrode pad 21 of a substrate are soldered with an FPCB (Flexible Print Circuit Board) 30 so as to be electrically connected with each other.

However, in the MEMS actuator, since the electrode terminal is structurally formed at a lower surface the problems are that it takes much time to solder the PCB to the electrode terminal and also troubles occurs frequently after the electrical connection.

Further, the camera module may be defective due to high temperature and thermal shock during the soldering.

Meanwhile, a camera has a shutter which functions to control time for transferring light through a lens to an image sensor. The shutter is opened only for a predetermined time period to allow light to pass and then closed after the predetermined time period to block out the light. The shutter takes the shape of a coil to obtain magnetic field and electromagnetic force for driving the shutter.

In order to connect a coil wire terminal of the shutter and positive and negative pads of a substrate which can perform a command of a driver IC, a manual soldering method and a method of coating and hardening conductive Ag-epoxy resin are main used. However, these methods have some problems in workability and productivity, and also any connection method applied to a very small space such as a camera module always has various problems.

There are some representative problems in that a terminal of snubber circuit of the sensitive MEMS actuator is weak in heat, flux gas of lead generated upon soldering has bad influence on an image sensor and an IR filter, thereby deteriorating an image quality, and a short-circuit with respect to a peripheral terminal such as a grounding portion may be generated, thereby causing a trouble in the operation of the shutter.

DISCLOSURE

Technical Problem

An object of the present invention is to provide a camera module which can facilely form an electrical connection between an electrode terminal of an MEMS actuator and an electrode pad of a substrate, Further, another object of the present invention is to a camera module in which a shutter coil is connected with an output terminal pad by welding, thereby protecting other components of the camera module from heat and also preventing performance deterioration of an image sensor and the like.

Technical Solution

To achieve the object of the present invention, the present invention provides a camera module including a substrate which is provided with an electrode pad and an image sensor; a housing Which is stacked on the substrate and of which an upper portion is opened so that light is incident to the image sensor; a MEMS actuator which is installed at the housing and has an electrode terminal at one side thereof, and a conductive pattern which is formed at the housing, wherein a lower end of the conductive pattern is connected with the electrode pad of the substrate, and an upper end thereof is connected with the electrode terminal of the MEMS actuator.

Preferably, a lower end of the conductive pattern is exposed through a bottom surface of the housing so as to be connected with the electrode pad of the substrate, and an upper end of the conductive pattern is exposed through an upper surface of the housing so as to be connected with the electrode terminal of the MEMS actuator.

Preferably, the electrode pad of the substrate comprises a plurality of positive terminals and negative terminals, and a lower end of the conductive pattern is connected with the plurality of positive terminals and negative terminals.

Preferably, the housing includes a holder which forms a light running space through light is incident to the image sensor, and a lens barrel which is inserted into the light running space of the holder and formed with a hole so as to fix one or more lenses.

Preferably, the conductive pattern includes a first conductive pattern and a second conductive pattern, and the first conductive pattern is formed to be extended from the electrode pad to an inner surface of the light running space of the holder, and the second conductive pattern is formed at an outer surface of the lens barrel so as to be contacted with the first conductive pattern and also to be extended to an upper surface.

Preferably, an extended portion is formed at an upper end of the lens barrel so as to be contacted with the electrode terminal of the MEMS actuator, and the second conductive pattern is extended to an upper surface of the extended portion.

Further, the present invention provides a shutter coil connection method of the camera module, which has a shutter and a MEMS actuator for performing auto-focus, including welding a shutter coil extended from the shutter to an output terminal pad formed at a PCB so as to transfer a control signal of the shutter.

Preferably, wherein the shutter coil and the output terminal pad are respectively provided in a pair so as to be corresponding to a positive pole and a negative pole.

Preferably, the shutter coil is welded by a welding machine.

Preferably, the shutter coil has a diameter of 0.04~0.06 mm, and a voltage at a welding tip of the welding machine is 1.2~1.4V, and welding time of the welding machine is 5~9 ms.

Advantageous Effects

According to the present invention as described above, it is possible to improve electrical reliability between the electrode terminal of the MEMS actuator and the electrode pad of the substrate and facilely form the electrical connection therebetween, thereby reducing the number of processes.

Further, it is additionally possible to form the connection without the PCB, thereby enhancing price competitiveness.

Furthermore, according to one embodiment of the present invention, since the shutter coil is connected with the output terminal pad by welding, it is possible to protect other components of the camera module from heat and also prevent the performance deterioration of the image sensor and the like.

DESCRIPTION OF DRAWINGS

*28 The above and other objects, features and advantages of the present invention will become apparent from the following description of preferred embodiments given in conjunction with the accompanying drawings, in which.

BEST MODE

Figure 1:
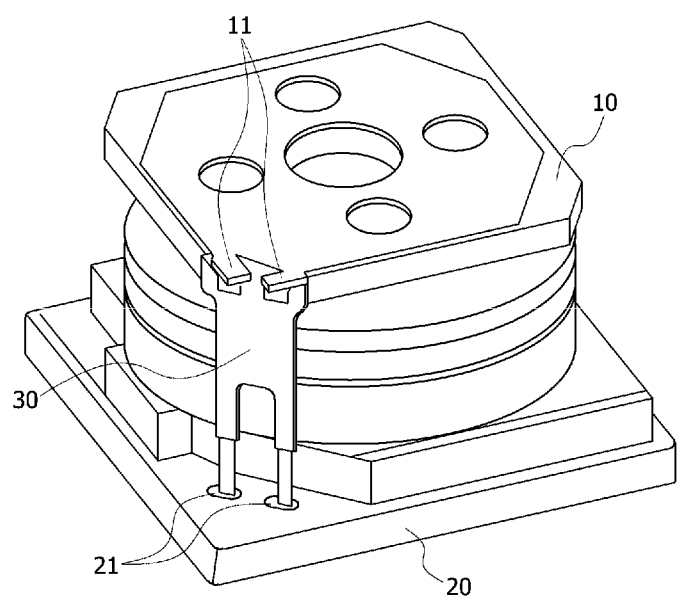
FIG. 1 is a perspective view of a conventional camera module.

Hereinafter, the embodiments of the present invention will be described in detail with reference to accompanying drawings. However, the present invention is not limited to the embodiments, and it should be understood that the present invention comprises all of equivalents and substitutes included in the technical scope and spirit of the invention.

It is to be noted that, in this specification, the expression that "a certain construction element is connected to another construction element" means that the certain construction element is directly connected to the construction element, and also means that a third construction element may be interposed therebetween.

On the other hand, the expression that "the certain construction element is directly connected to the construction element" means that the third construction element is not interposed therebetween.

The terms used herein are merely to describe a specific embodiment, and thus the present invention is not limited to them. Further, as far as singular expression clearly denotes a different meaning in context, it includes plural expression.

It is understood that terms "comprises", "comprising", "includes" or "has" intend to indicate the existence of features, numerals, steps, operations, elements and components described in the specification or the existence of the combination of these, and do not exclude the existence of one or more other features, numerals, steps, operations, elements and components or the existence of the combination of these or additional possibility beforehand.

Also, it is understood that accompanying drawings are enlarged or reduced for the convenience of explanation.

The same reference numerals are given to the same or corresponding parts, and the description thereof will not be repeated.

Figure 2:
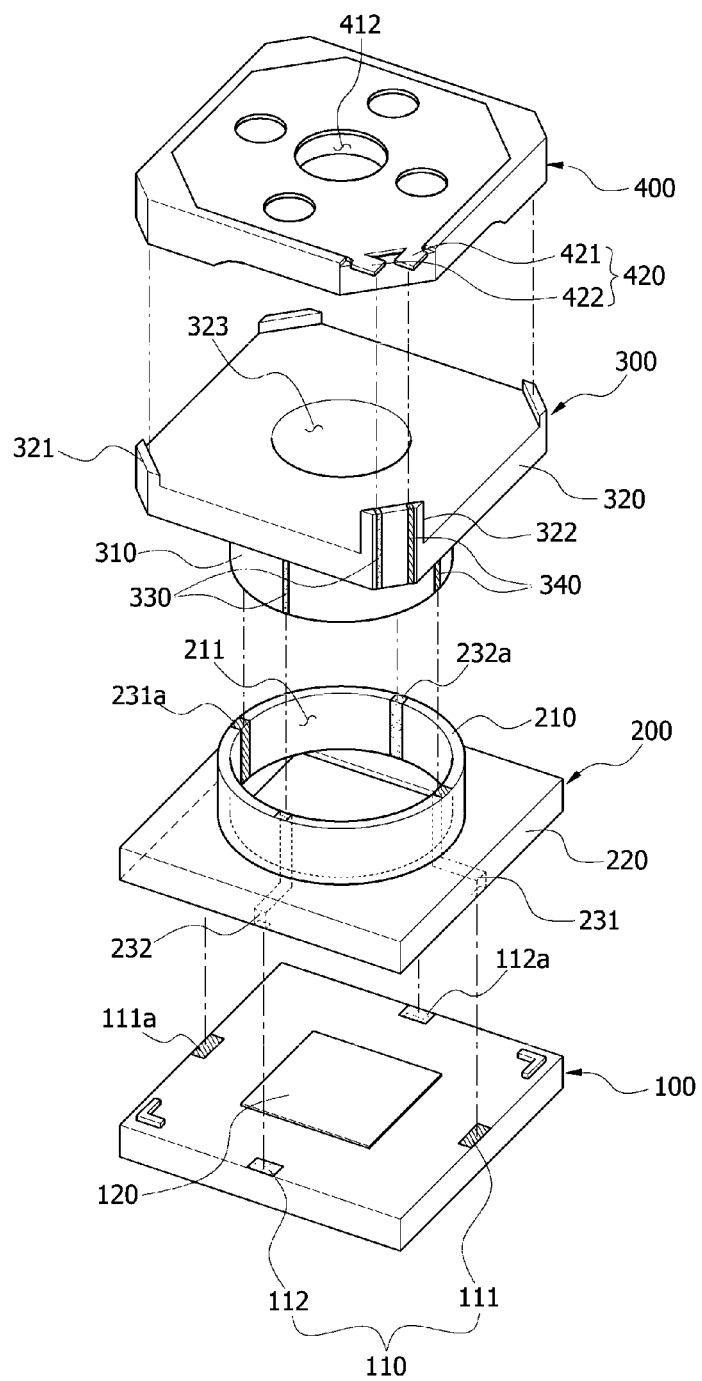
FIG. 2 is an exploded perspective view of a camera module according to an embodiment of the present invention.

Referring to FIG. 2, the camera module according to an embodiment of the present invention includes a substrate 100 in which an electrode pad 110 and an image sensor 120 are formed, an housing 200, 300 which is stacked on the substrate 100 and of which an upper portion is opened so that light is incident to the image sensor 120, an MEMs actuator 400 which is installed at the housing 200, 300 and has an electrode terminal 420 at one side thereof, and a conductive pattern which is formed at the housing 200, 300. A lower end of the conductive pattern is connected with the electrode pad 110, and an upper end thereof is connected with the electrode terminal 420 of the MEMS actuator 400.

The conductive pattern can be formed by all general methods of forming a conductive material, and also can be patterned at the same time of injection molding of the housing.

A general PCB can be used as the substrate 100. At an upper surface of the substrate 100, there is formed an electric wiring.

In the electrode pad 110 of the substrate 100, a positive terminal 111 and a negative terminal 112 are formed at a side surface of the substrate 100, and also another positive terminal 111a and another negative terminal 112a may be formed at an opposite side surface thereof.

The image sensor 120 may include a pixel area (not shown) having a plurality of pixels, and a plurality of electrodes (not shown). Herein, the pluralities of electrodes are electrically connected with electrodes (not shown) of the substrate 100 by using a wire bonding equipment.

The housing 200, 300 may have any structure, if it can be stacked on the substrate 100, and its upper portion is opened so that light is incident to the image sensor 120, and the MEMS actuator 400 can be fixed thereon.

In the camera module according to the embodiment of the present invention, the housing has a structure that a holder 200 and a lens barrel 300 are coupled with each other.

The holder 200 is formed at the substrate 100 so as to form a light miming space 211 which is opened so that light is incident to the image sensor 120.

More detailed, an upper portion of the light running space 211 may be formed into a cylindrical opening so as to receive the lens barrel 300, and a lower portion thereof may be formed into a square opening so that light is incident to the image sensor 120. Therefore, an upper portion 210 of the holder 200 is formed into a cylindrical shape, and a lower portion 220 thereof is formed into a square shape.

However, the holder 200 may have any structure or shape, if it can form the light running space 211.

A first conductive pattern 231, 232 is formed at an inner side surface of the light running space 211. The first conductive pattern 231, 232 will be described in detail with reference to FIGS. 3a to 3c.

Figure 3A:
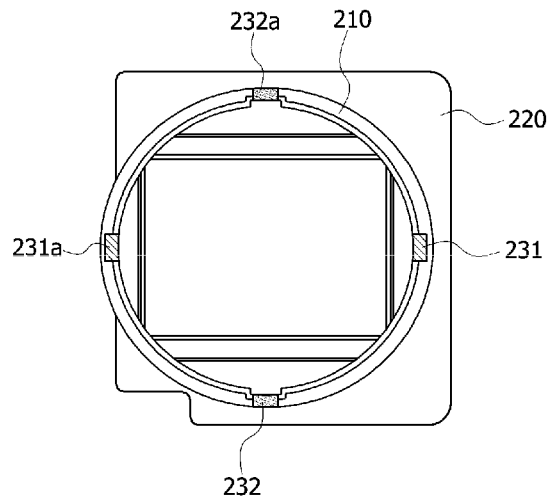
FIG. 3a is a plan view of camera module housing according to the embodiment of the present invention.
Figure 3B:
FIG. 3b is a side view of the camera module housing according to the embodiment of the present invention.
Figure 3C:
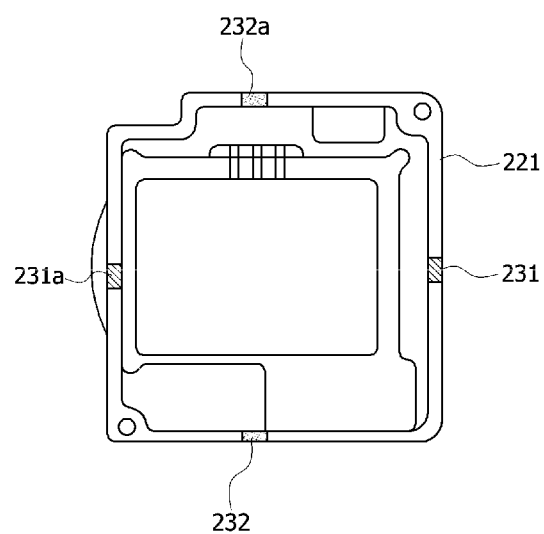
FIG. 3c is a bottom view of the camera module housing according to the embodiment of the present invention.

As shown in FIGS. 3a and 3b, the first conductive pattern 231, 232 is formed at the inner side surface of the light running space 211 so as to have a desired thickness and width. Further as shown in FIG. 3c, the first conductive pattern 231, 232 is exposed through a side surface of a bottom surface 221 of the holder 200 so as to be electrically connected with the electrode pad 110 when the holder 200 is stacked on the substrate 100 of FIG. 2.

Herein, the first conductive pattern 231, 232 exposed through the bottom surface 221 of the holder 200 is bonded so as to be electrically connected by using a conductive adhesive such as Ag-epoxy.

In case that the electrode pad 110 of the substrate 100 is provided in plural number 111a, 112a, another conductive pattern 231a, 232a which is not described is electrically connected with them.

The lens barrel 300 is disposed at the upper portion of the holder 200, and a circular hole 232 is formed at a center portion of the lens barrel 300 so as to open the lens barrel 300 up and down. A fixed lens (not shown) is inserted into the circular hole 232, and a second conductive pattern 330, 340 is formed at an outer surface of the lens barrel 300.

The lens barrel 300 has a desired size and shape which can be inserted into the light running space 211.

Figure 4:
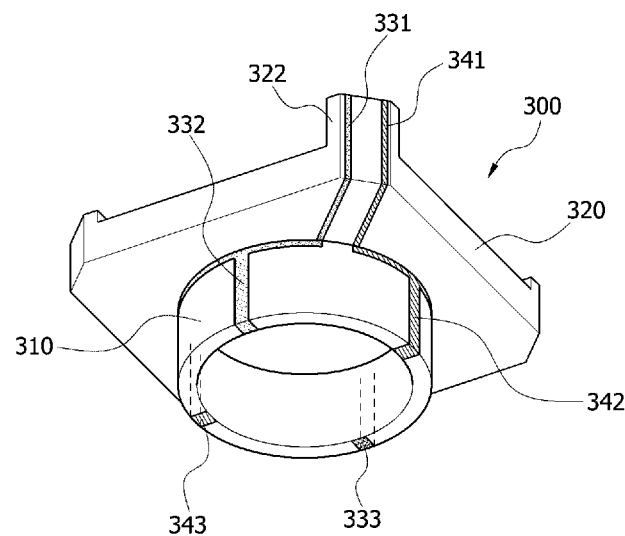
FIG. 4 is a perspective view of a lens barrel of the camera module according to the embodiment of the present invention.
Figure 5:
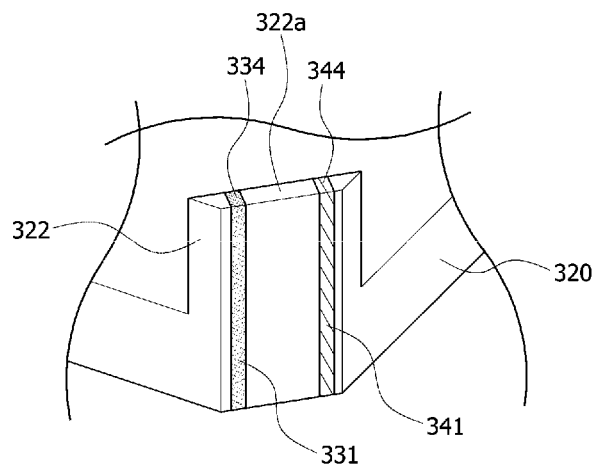
FIG. 5 is an enlarged view of the lens barrel according to the embodiment of the present invention.

Referring to FIGS. 4 and 5, the second conductive pattern 330, 340 includes a lower end 332, 342, an upper end 334, 344, and a connection wire 331, 341 which electrically connects the lower end 332, 342 and the upper end 334, 344.

The lower end 332, 342 of the second conductive pattern 330, 340 is formed at an outer surface of the lower end 310 of the lens barrel 300 in a height direction thereof so as to be electrically connected with the first conductive pattern 231, 232 of the holder 200 by contacting each other.

Another lower end 333, 343 of the second conductive pattern 330, 340 may be additionally formed according to the number of the electrode pads 110 formed at the substrate 100. If one of the conductive patterns is defective, the electrical connection can be maintained by using other conductive patterns, thereby increasing electrical reliability thereof.

Hereinafter, construction of forming the electric connection between the lens barrel 300 and the electrode terminal 420 of the MEMS actuator 400 will be described.

An upper portion 320 of the lens barrel 300 is formed into a plate shape, and protrusions 321 are formed at a side surface thereof so as to fix the MEMS actuator 400. One of the protrusions 321 is protruded upward in a desired height so as to form an extended portion 322. As shown in FIG. 4, the upper end 334, 344 of the second conductive pattern 330, 340 is formed at an upper surface 322a of the extended portion 322, The extended portion 322 has a desired height which can be contacted with the electrode terminal 420 of the MEMS actuator 400 when the MEMS actuator 400 is installed at the lens barrel 300.

The MEMS actuator minutely adjusts a moving lens (not Shown) using a silicon wafer instead of an existing voice coil, and the electrode terminal 420 is formed at an upper surface thereof.

An opening 412 is formed at a center portion of the MEMS actuator 400. Although not shown in the drawings, a lens mount pad (not shown) for supporting the moving lens (not shown) is formed at a side surface of the opening 412. The lens mount pad is driven up and down by electrostatic force so as to adjust focus of the moving lens.

The electrode terminal 420 of the MEMS actuator 400 includes a positive electrode 421 and a negative electrode 422 which are electrically connected by being contacted with. Herein, in order to secure the electrical reliability, the electrode terminal 420 and the upper end 334, 344 of the second conductive pattern 330, 340 may be fixed to each other using a conductive adhesive.

Herein, in order to prevent an electrical short with adjacent electrodes, the conductive adhesive is an anisotropic conductive adhesive.

By such a construction, the electrode pad 110 of the substrate 100 and the electrode terminal 420 of the MEMS actuator 400 are connected with other through the first and second conductive patterns 231, 232, 330, 340 so as to be electrically connected at the same time of assembling the camera module, thereby simplifying a manufacturing process thereof.

Figure 6:
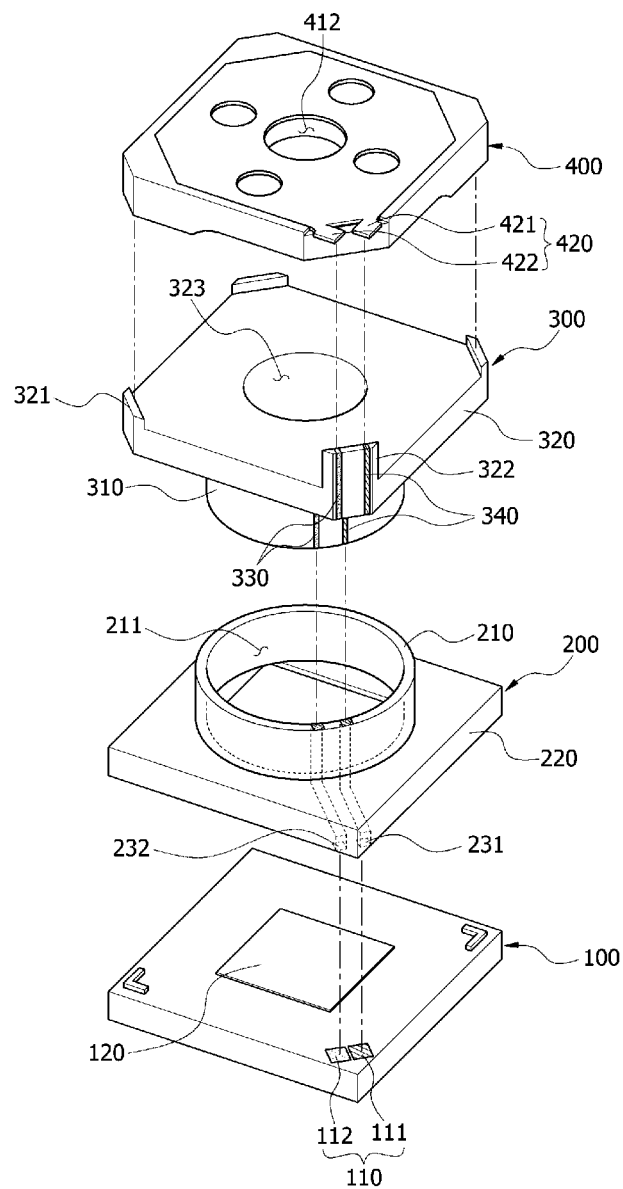
FIG. 6 is an exploded perspective view of a camera module according to another embodiment of the present invention.

FIG. 6 shows an exploded perspective view of a camera module according to another embodiment of the present invention.

Since a construction of the camera module of the embodiment is the same as that of the previous embodiment, detailed description thereof will be omitted.

In the camera module of the embodiment of the present invention, the positive terminal 111 and the negative terminal of the electrode pad 110 are formed at one side of the substrate 100 so as to be electrically connected with the first conductive pattern 231, 232.

Further, the first conductive pattern 231, 232 is electrically connected with the second conductive pattern 330, 340 of the lens barrel 300, and the second conductive pattern 330, 340 is connected with the electrode terminal 410 of the MEMS actuator 400.

By such a construction, the electrode pad 110 formed at the substrate 100 can be facilely connected with the electrode terminal 420 of the MEMS actuator 400. Particularly, the electrode pad 110 does not need to change its existing position, and an extra manufacturing cost is not needed.

Figure 7:
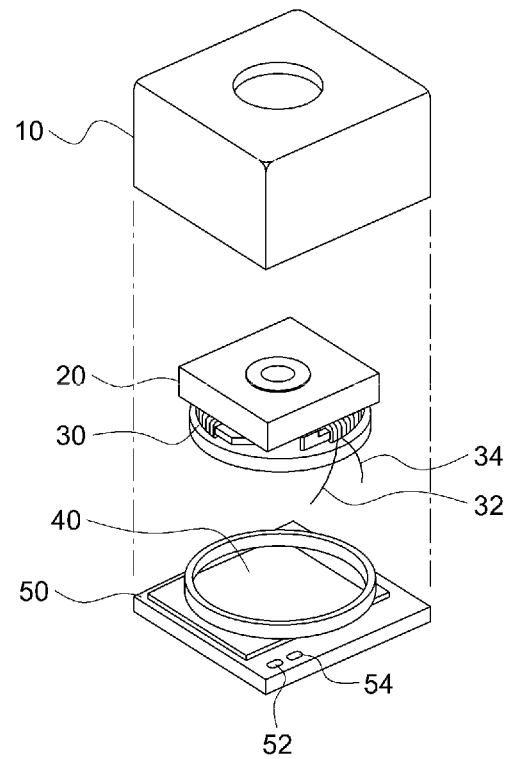
FIG. 7 is an exploded perspective view of the camera module including an MEMS actuator and a shutter.

FIG. 7 is an exploded perspective view of the camera module including an MEMS actuator and a shutter. As shown in FIG. 7, the camera module manufactured by a shutter coil connection method according to the present invention includes an MEMS actuator 20 and a shutter 30 in order to reduce its weight and size. The camera module may include an electromagnetic shielding box 10, an image sensor 40 and a PCB 50.

In the MEMS actuator 20, a comb driver functions to adjust the focus using electrostatic force and the shutter 30 is operated at a predetermined speed by magnetic field and electromagnetic force based on a shutter coil wound on a magnetic body. The image sensor 40 functions to receive an optical signal from an outside and convert it into an electric signal, and the PCB 50 is a ceramic substrate on which a circuit for transferring various electric signals is printed. The image sensor 40, the electromagnetic shielding box 10 and the like may be mounted on an upper pad of the PCB 50.

In case of the camera module manufactured by the shutter coil connection method according to the present invention, since it has a small size, if each element is mounted on the PCB 50, a connection space of the shutter coil 32, 34 becomes very narrow. Particularly, in case of welding, it may exert a bad influence on other elements.

Figure 8:
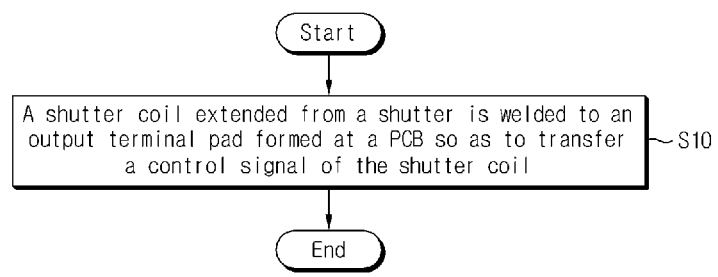
FIG. 8 is a flow chart showing a connection method of a shutter coil of the camera module according to an embodiment of the present invention.

FIG. 8 is a flow chart showing a connection method of a shutter coil of the camera module according to an embodiment of the present invention. Referring to FIG. 8, in the shutter coil connection method of the camera module according to the present invention, the shutter coil 32, 34 extended from the shutter 30 is welded to an output terminal pad 52, 54 formed at the PCB 50 in order to transfer a control signal of the shutter 30 (S10).

Herein, the shutter coil 32, 34 is a wire which is extended from the coil wound on the magnetic body of the shutter 30 to an outside. The shutter coil 32, 34 is formed of copper. Further, the output terminal pad 52, 54 of the PCB 50 is provided in a pair so as to be welded with the shutter coil 32, 34 having a positive pole and a negative pole. The output terminal pad 52, 54 is formed by gold-plating on a copper foil.

In the welding process, the shutter coil 32, 34 is welded by a welding machine W. In case that the shutter coil 32, 34 has a diameter of 0.04~0.06 mm, it is preferable that a voltage at a welding tip of the welding machine W is 1.2~1.4V and welding time of the welding machine W is 5~9 ms. In this case, since heat is generated locally, the heat does not have any influence on other elements (e.g., the image sensor or the MEMS actuator).

Figure 9:
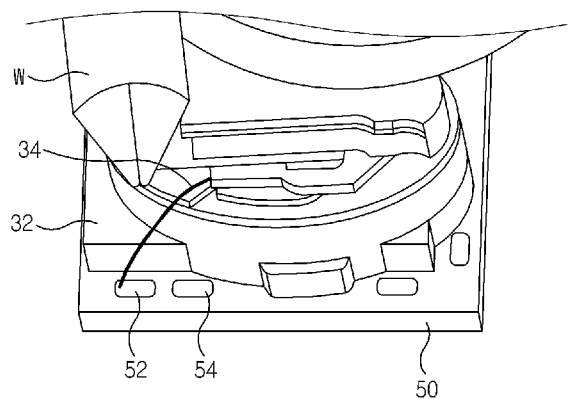
FIGS. 9 to 12 are photographs showing a connecting process in the connection method of a shutter coil of the camera module according to the embodiment of the present invention.
Figure 10:
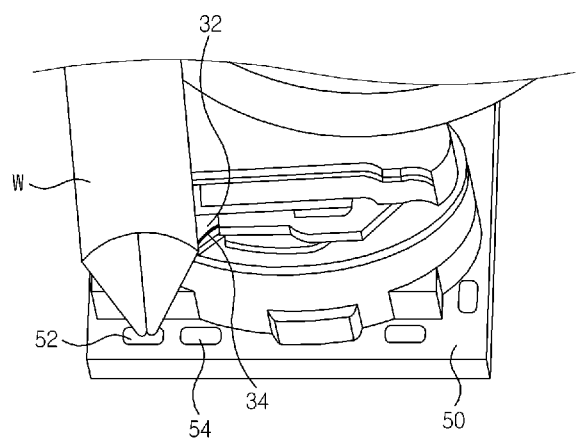
Figure 11:
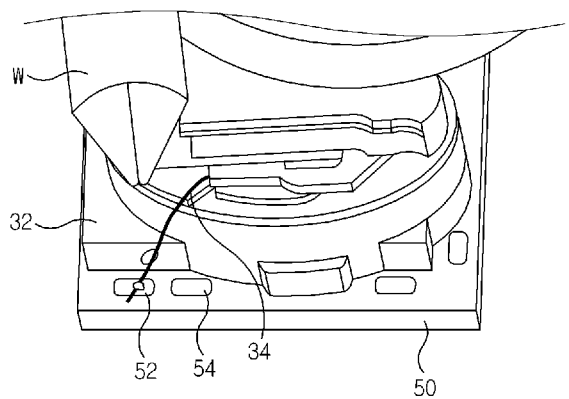
Figure 12:
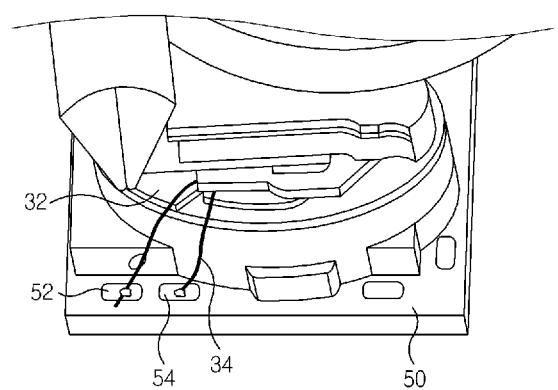

FIGS. 9 to 12 are photographs showing a connecting process in the connection method of a shutter coil of the camera module according to the embodiment of the present invention. As shown in FIGS. 9 to 11, each shutter coil 32, 34 is welded to the output terminal pad 52, 54 so as to be corresponding to a positive pole and a negative pole suing the welding machine W. Herein, the output terminal pad 52, 54 and the shutter coil 32, 34 are directly coupled with each other using the heat which is locally generated at a contacted point therebetween by a potential difference of the welding tip without a solder, Finally, as shown in FIG. 12, since the connection is not achieved by a solder, it is not necessary to provide a space for other material (e.g., solder, Ag-epoxy), and also it is facile to mount the electromagnetic shielding box 10.

Although various embodiments are provided herein in order to explain the principles, the present invention is not limited to these embodiments.

INDUSTRIAL APPLICABILITY

According to the present invention as described above, it is possible to improve electrical reliability between the electrode terminal of the MEMS actuator and the electrode pad of the substrate and facilely form the electrical connection therebetween, thereby reducing the number of processes.

Further, it is additionally possible to form the connection without the PCB, thereby enhancing price competitiveness.

Furthermore, according to one embodiment of the present invention, since the shutter coil is connected with the output terminal pad by welding, it is possible to protect other components of the camera module from heat and also prevent the performance deterioration of the image sensor and the like.

While the present invention has been described with respect to the specific embodiments, it will be apparent to those skilled in the art that various changes and modifications may be made without departing from the spirit and scope of the invention as defined in the following claims.

The invention claimed is:

1. A camera module comprising:
   a substrate including an electrode pad;
   an image sensor disposed on the substrate;
   a housing fixed on the substrate and accommodating a first lens;
   an actuator disposed on the housing and including an electrode terminal and a second lens; and
   a conductive pattern having a first end electrically connected to the electrode pad and a second end connected to the electrode terminal,
   wherein the conductive pattern extends along a surface of the housing from the electrode pad to the electrode terminal,
   wherein the housing is disposed on an upper surface of the substrate,
   wherein the conductive pattern includes a bottom conductive pattern disposed on a bottom surface of the housing, and
   wherein at least a portion of the bottom conductive pattern surface-contacts with the electrode pad disposed on the upper surface of the substrate.

2. The camera module according to claim 1, wherein the actuator comprises a micro electromechanical system (MEMS) actuator.

3. The camera module according to claim 1, wherein the electrode pad of the substrate comprises two terminals.

4. The camera module according to claim 1, wherein the actuator has an opening for fixing the second lens.

5. The camera module according to claim 1, further comprising:
   a shutter disposed on the actuator,
   wherein a shutter coil extended from the shutter is welded to an output terminal pad formed at the substrate.

6. The camera module according to claim 5, wherein the shutter coil and the output terminal pad are respectively provided in a pair so as to be corresponding to a positive pole and a negative pole.

7. The camera module according to claim 6, wherein the shutter coil is welded by a welding machine.

8. A phone having a camera module of claim 1.

9. The camera module according to claim 1, wherein the bottom conductive pattern and the electrode pad are contacted by a conductive adhesive.

10. A camera module comprising:
    a substrate including an electrode pad;
    an image sensor disposed on the substrate;
    a housing fixed on the substrate and accommodating a first lens;
    an actuator disposed on the housing and including an electrode terminal and a second lens; and
    a conductive pattern having a first end electrically connected to the electrode pad and a second end connected to the electrode terminal,
    wherein the conductive pattern extends along a surface of the housing from the electrode pad to the electrode terminal,
    wherein the housing comprises a holder disposed on the substrate and a lens barrel comprising the first lens, the lens barrel being coupled to the holder,
    the conductive pattern comprises a first pattern and a second pattern, and
    the first pattern is formed on an inner surface of the holder and the second pattern is formed on an outer surface of the lens barrel.

11. The camera module according to claim 10, wherein said first end of the conductive pattern is one end of the first pattern and said second end of the conductive pattern is one end of the second pattern.

12. The camera module according to claim 10, wherein an extended portion is formed at an upper end of the lens barrel so as to be contacted with the electrode terminal of the actuator, and the second pattern is extended to an upper surface of the extended portion.

13. The camera module according to claim 10, wherein the one end of the first pattern is bonded to the electrode pad by a conductive adhesive.

14. The camera module according to claim 10, wherein the one end of the second pattern is bonded to the actuator by a conductive adhesive.

* * * * *